United States Patent
Thompson

(10) Patent No.: US 8,243,446 B2
(45) Date of Patent: Aug. 14, 2012

(54) PHOTOVOLTAIC INVERTER

(75) Inventor: Christopher Thompson, Narragansett, RI (US)

(73) Assignee: First Solar, Inc., Perrysburg, OH (US)

( * ) Notice: Subject to any disclaimer, the term of this patent is extended or adjusted under 35 U.S.C. 154(b) by 212 days.

(21) Appl. No.: 12/722,181

(22) Filed: Mar. 11, 2010

(65) Prior Publication Data

US 2011/0222242 A1 Sep. 15, 2011

(51) Int. Cl.
*H05K 7/20* (2006.01)

(52) U.S. Cl. ........... 361/695; 361/691; 361/679.46; 361/679.48; 361/103; 363/133; 363/134; 363/141; 307/65; 307/66; 700/297

(58) Field of Classification Search ........... 361/679.46–679.54, 688, 689, 361/736, 752, 82, 103–106, 605, 606, 625, 361/809, 690–727; 363/15, 26, 17, 39, 63–65, 363/73–80, 60, 71, 243–246, 251, 255, 249, 363/252, 253, 292, 24, 55, 95, 97, 134, 141; 165/104.33, 104.34, 121–126, 80.2, 80.3, 165/80.4, 80.5, 185; 700/297–301; 702/183, 702/184, 188; 307/11, 44, 75, 77, 112, 117, 307/143–148, 82, 80, 47; 454/184; 257/706–727; 62/259.2; 323/266, 285, 299, 905, 906
See application file for complete search history.

(56) References Cited

U.S. PATENT DOCUMENTS

| | | | | |
|---|---|---|---|---|
| 5,170,336 A * | 12/1992 | Getter et al. | | 363/141 |
| 5,612,580 A * | 3/1997 | Janonis et al. | | 307/64 |
| 6,000,912 A * | 12/1999 | Takada et al. | | 417/32 |
| 6,038,156 A * | 3/2000 | Inam et al. | | 363/133 |
| 6,191,546 B1 * | 2/2001 | Bausch et al. | | 318/471 |
| 6,215,682 B1 * | 4/2001 | Akamatsu | | 363/141 |
| 6,233,149 B1 * | 5/2001 | Bailey et al. | | 361/704 |
| 6,278,080 B1 * | 8/2001 | Moriguchi et al. | | 219/130.1 |
| 6,630,622 B2 | 10/2003 | Konold | | |
| 6,806,415 B2 * | 10/2004 | Fujisaki et al. | | 136/259 |
| 6,980,450 B2 * | 12/2005 | Bhate et al. | | 363/134 |
| 7,023,712 B2 * | 4/2006 | Miettinen | | 363/34 |
| 7,324,361 B2 * | 1/2008 | Siri | | 363/95 |
| 7,345,561 B2 * | 3/2008 | Meyer et al. | | 336/61 |
| 7,397,653 B2 * | 7/2008 | Taylor | | 361/676 |

(Continued)

FOREIGN PATENT DOCUMENTS

WO  WO 01/78176 A1  10/2001

OTHER PUBLICATIONS

PV GAP Inverters for photovoltaic (PV) stand-alone systems. Manual [online]. Project Management Office (PMO), World Bank/GEF Assisted China Renewable Energy Development Project, State Economic and Trade Comission, Beijing, People's Republic of China—Sep. 2002, Retrieved from http://www.iecee.org/pv/pvrs/PVRS8A.pdf on Apr. 27, 2011.

*Primary Examiner* — Michail V Datskovskiy

(74) *Attorney, Agent, or Firm* — Dickstein Shapiro LLP

(57) ABSTRACT

A DC to AC inverter used in a solar cell power system can include an improved control scheme for cooling itself and optimizing power output.

18 Claims, 3 Drawing Sheets

U.S. PATENT DOCUMENTS

| | | | |
|---|---|---|---|
| 7,538,426 B2* | 5/2009 | Yamabuchi et al. | 257/714 |
| 7,596,008 B2* | 9/2009 | Iwata et al. | 363/71 |
| 7,598,694 B2* | 10/2009 | Ishii et al. | 318/471 |
| 7,738,228 B2* | 6/2010 | Taylor | 361/103 |
| 7,855,906 B2* | 12/2010 | Klodowski et al. | 363/97 |
| 7,859,241 B2* | 12/2010 | Yoshida et al. | 323/285 |
| 7,989,983 B2* | 8/2011 | Folts et al. | 307/82 |
| 8,023,266 B2* | 9/2011 | Russell et al. | 361/702 |
| 8,042,993 B2* | 10/2011 | Van Maanen | 374/43 |
| 2003/0111908 A1* | 6/2003 | Christensen | 307/43 |
| 2005/0257546 A1* | 11/2005 | Ishishita | 62/236 |
| 2006/0017328 A1 | 1/2006 | Bryde | |
| 2006/0085167 A1* | 4/2006 | Warfield et al. | 702/188 |
| 2007/0081372 A1* | 4/2007 | Xiong Zeng et al. | 363/132 |
| 2007/0202367 A1* | 8/2007 | Yoshida | 429/13 |
| 2007/0279863 A1* | 12/2007 | Illerhaus | 361/695 |
| 2009/0316457 A1 | 12/2009 | Friebe et al. | |
| 2010/0057267 A1* | 3/2010 | Liu et al. | 700/297 |
| 2010/0134959 A1* | 6/2010 | Fife et al. | 361/678 |
| 2010/0231045 A1* | 9/2010 | Collins et al. | 307/47 |
| 2010/0264739 A1* | 10/2010 | Errington | 307/80 |
| 2010/0275971 A1* | 11/2010 | Zingher | 136/246 |
| 2010/0277002 A1* | 11/2010 | Folts et al. | 307/82 |
| 2010/0302731 A1* | 12/2010 | Belikoff et al. | 361/697 |
| 2010/0319684 A1* | 12/2010 | Almogy et al. | 126/714 |
| 2011/0015881 A1* | 1/2011 | Chen et al. | 702/58 |
| 2011/0118488 A1* | 5/2011 | Bermejo Gonzalez et al. | 552/526 |

* cited by examiner

PHOTOVOLTAIC INVERTER

TECHNICAL FIELD

This invention relates to a DC to AC inverter used in a solar cell power system having an improved control scheme for cooling itself and optimizing power output.

BACKGROUND

A solar module-based power system uses an inverter to convert direct current (DC) from a photovoltaic array into alternating current (AC) for use with home appliances or possibly a utility grid. Inverters can be cooled to be overdriven to increase power output over a rated power output.

DETAILED DESCRIPTION

Figure 1:
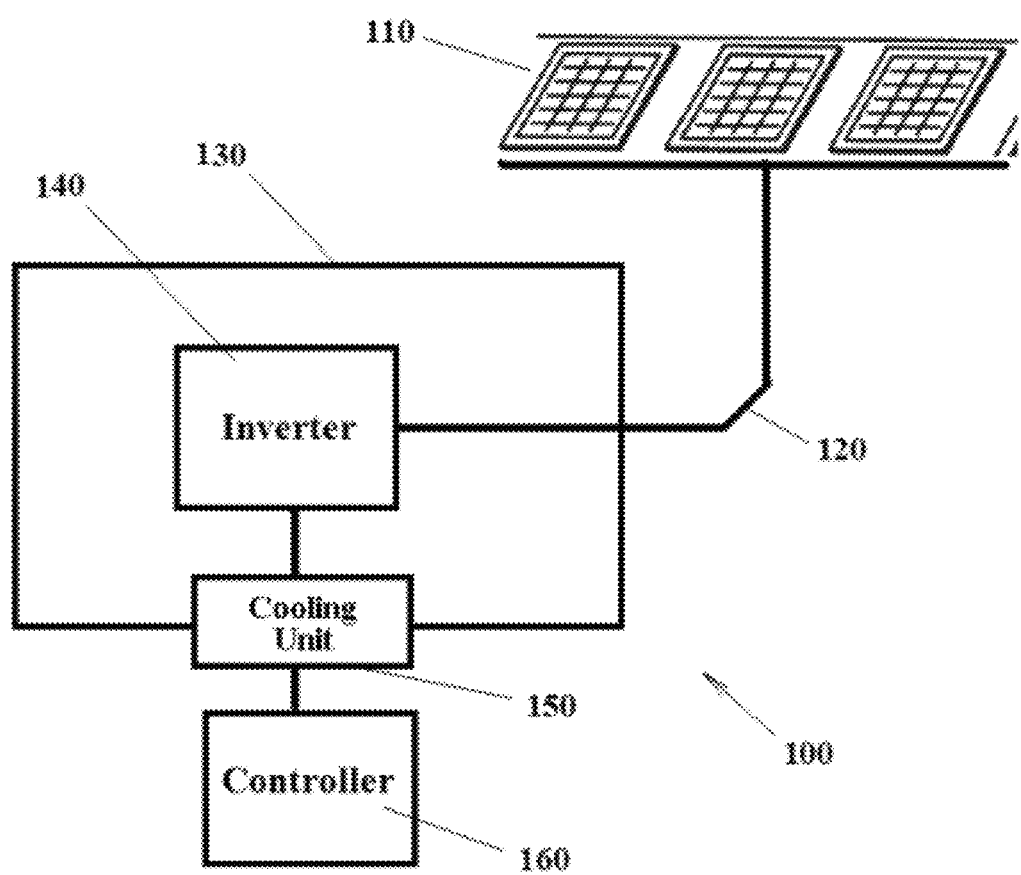
FIG. 1 is a block diagram illustrating the connection of parts in the solar power system.

An inverter can be used in a solar module-based power system to convert direct current (DC) from a photovoltaic (PV) array into alternating current (AC) for use with home appliances or an alternating-current utility grid. Inverters are rated for operation at a temperature point (typically 50 degrees C.). Operating temperature can be optimized to provide even better performance that that obtained at the rated temperature, to increase the current capabilities of a given inverter. A DC to AC inverter unit having an improved control scheme for cooling itself and optimizing its power output is described. With the improved control scheme, an improvement in the power output capabilities and efficiency can be achieved.

In one aspect, a DC to AC inverter unit can include an enclosure, a DC to AC inverter within the enclosure, an input power sensor configured to monitor input power, a temperature sensor configured to monitor the temperature within the enclosure, a cooling unit in thermal communication with the inverter, and a cooling unit controller. The inverter can have a rated power output at a first temperature within the enclosure. The cooling unit controller can be capable of adjusting the cooling unit based on the input power and the temperature within the enclosure. The cooling unit controller can adjust the cooling unit to maintain the inverter at a second temperature sufficient to allow the inverter to be overdriven to have an optimized power output over the rated power output. The cooling unit can include a cooling air fan. The cooling unit can include an air conditioner. The DC to AC inverter unit can further include a DC input from a solar module to the DC to AC inverter.

The cooling unit controller can adjust the cooling unit to maintain the inverter at a second temperature sufficient to allow the inverter to be overdriven to increase power output by at least 5% or at least 15% over the rated power output. The DC to AC inverter unit of claim 1, wherein the cooling unit controller adjusts the cooling unit to keep the temperature in the enclosure below about 50 degrees C., 30 degrees C., or 20 degrees C.

In another aspect, a method of cooling a DC to AC inverter can include measuring the temperature inside an enclosure cooled by a cooling unit, the enclosure including a DC to AC inverter having a rated power output at a first temperature. The DC to AC inverter can be electrically connected to a photovoltaic array. The method can include measuring the voltage output of the photovoltaic array. The method can include controlling the cooling unit based on the temperature inside the enclosure and the voltage output of the photovoltaic array.

The cooling unit can include a cooling air fan. The cooling unit can include an air conditioner. Controlling the cooling unit can include maintaining the inverter at a second temperature sufficient to allow the inverter to be overdriven to increase power output by at least 5% or at least 15% over the rated power output. Controlling the cooling unit comprises maintaining the temperature in the enclosure below about 50 degrees C., 30 degrees C., or 20 degrees C.

Inverters are rated for operation at a temperature point (typically 50 degrees C.). Operating temperature can be optimized to provide even better performance that that obtained at the rated temperature, to increase the current capabilities of a given inverter. For example, an inverter might be able to provide 100% of capacity up to 50 degree C. However at 40 degree C. it may be able to provide 115% of capacity. In practice, these inverters are often installed inside an enclosure that provides environmental protection. The enclosure can have both fan cooling and air conditioning. When the temperate is not very high, the enclosure can only run fans to bring in outdoor air that can be used to cool the inverter. Under hot conditions, the fans turn off and a separate air conditioning system is run. Air conditioning uses a lot of power so running air conditioning results in reduced photovoltaic array output power.

Referring to FIG. 1, solar power system 100 can include photovoltaic or solar array 110. Solar modules 110 can be arranged in any suitable manner, for example, in arrays positioned on the ground or on rooftops. Solar array 110 can include any suitable photovoltaic devices, including thin-film solar devices such as cadmium telluride (CdTe) or copper indium gallium selenide (CIGS). Alternatively, the photovoltaic devices can be crystalline silicon solar devices or any other suitable photovoltaic devices capable of generating direct current electricity. DC electric current generated by photovoltaic array 110 can output to DC to AC inverter 140 by cable 120.

DC to AC inverter 140 can include any suitable apparatus or combination which can convert DC current from a photovoltaic array to AC current. DC to AC inverter 140 can include any suitable mechanical device, electromechanical device, electrical or electronic device, or any suitable combination thereof. DC to AC inverter 140 can include a modified sine wave inverter. DC to AC inverter 140 can include a pure sine wave inverter. DC to AC inverter 140 can include a generator, alternator, or motor, or any suitable combination thereof. DC to AC inverter 140 can include a solid-state inverter. DC to AC inverter 140 can be installed in enclosure 130. Solar power system 100 can include cooling unit 150. Cooling unit can include an air fan or air conditioner. Solar power system 100 can include cooling unit controller 160.

The inverter units typically have a very simple cooling system that turn on the air conditioner when the temperature reaches a certain set point. For example it could be set to 40 degree C. and at that point the air conditioner would be turn on. Below that temperature, the air conditioner will be off. However this one variable control scheme does not factor in the true performance capability of the inverter. If the PV array is not producing much power, then the inverter could potentially run to 50 degree C. without air conditioning. In such case the air conditioning can be stay off. Similarly, if the PV array is producing a lot of power, it can be advantageous to cool the inverter and harvest the extra power. For example, the AC could be turned on to cool the inverter to 30 degree C., at which point the inverter may be able to be run at 125%. In some embodiments, this invention can have the controls embedded into the inverter or the controls could be external to the inverter. This enables the inverter to harvest the most power but use the AC the least amount possible.

Figure 2:
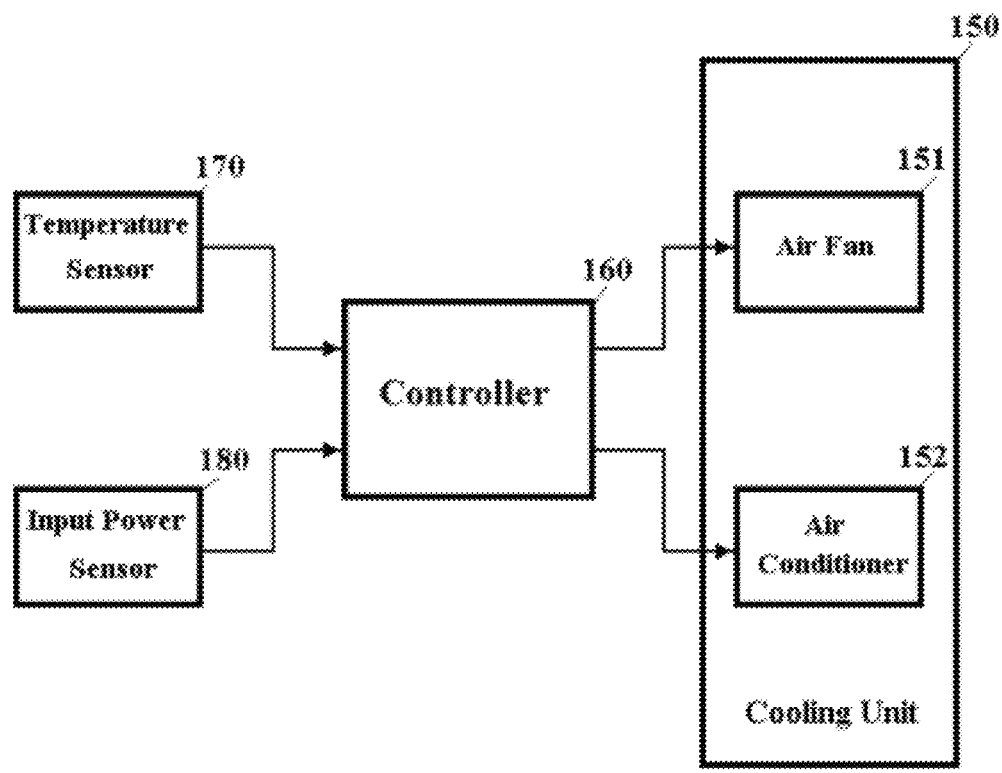
FIG. 2 is a block diagram illustrating the connection of parts in the solar power system.

Referring to FIG. 2, cooling unit 150 can include air fan 151 and air conditioner 152. Temperature sensor 170 can be positioned adjacent to the inverter. Temperature sensor 170 can be configured to monitor the temperature within the enclosure. Input power sensor 180 can be configured to monitor input power. Cooling unit controller 160 can be capable of controlling cooling unit 150 based on the input power and the temperature within the enclosure. In some embodiments, cooling unit controller 160 can control cooling unit 150 to maintain the inverter at a temperature sufficient to allow the inverter to be overdriven to have an optimized power output over the rated power output.

Figure 3:
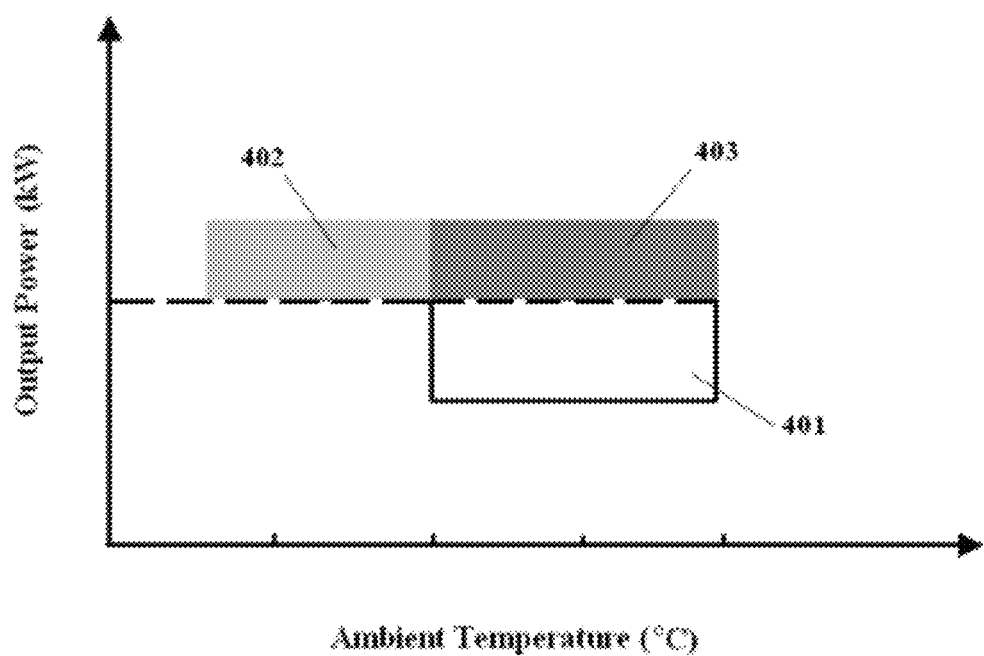
FIG. 3 is a diagram illustrating the inverter overdrive.

FIG. 3 includes a graphical representation of how an inverter can be overdriven in accordance with the present invention by the improved control scheme. Overdrive means the inverter can be maintained at a lower temperature to allow the inverter to expand power output capacity higher than the rated power output capacity. This invention allows overdrive to be enabled as much as possible without the need for air conditioning. Air conditioning can be activated, for example, when the PV array is producing a lot of power. Normal operation region 401 represents the cases that the unit can still run without air conditioning if the load of the inverter is less than 100%. Free overdrive region 402 represents the cases that the unit can still be overdriven without turning on air conditioning. This would cover "clipping" period (a relatively cool temperature, but sunshine sufficient to generate power in excess of the rated inverter output disclosed, for example, in the nameplate rating) without the need of air conditioning. Forced overdrive region 403 represents the cases that the unit can only possibly be overdriven by using air conditioning. With an external cooling source being used as a means of lowering the "ambient" temperature surrounding the inverter, the inverter can operate at a rating above its nameplate rating in region 403. The external cooling source can be an air conditioning module, an air circulation module, or any suitable means of lowering the "ambient" temperature.

The increased inverter output obtainable by the present invention can result in various efficiencies. First, as described above, selective overdriving of inverters can result in capturing of previously wasted photovoltaic array output during "clipping" period. Also, fewer inverters can be overdriven as necessary to equal the combined output of a greater number of inverters driven strictly in accordance with the nameplate rating. Additionally, smaller capacity inverters can be overdriven to equal the output of an equal number of larger capacity (according to nameplate rating) inverters. Further, air conditioning can be off to achieve higher efficiency, for example, during the simultaneous conditions of low output of PV array and high temperature.

A number of embodiments of the invention have been described. Nevertheless, it will be understood that various modifications may be made without departing from the spirit and scope of the invention. It should also be understood that the appended drawings are not necessarily to scale, presenting a somewhat simplified representation of various preferred features illustrative of the basic principles of the invention.

What is claimed is:

1. A DC to AC inverter unit comprising:
    an enclosure;
    a DC to AC inverter within the enclosure, the inverter having a rated power output at a first temperature within the enclosure;
    an input power sensor configured to monitor input power;
    a temperature sensor configured to monitor the temperature within the enclosure;
    a cooling unit in thermal communication with the inverter; and
    a cooling unit controller capable of adjusting the cooling unit based on the input power and the temperature within the enclosure.

2. The DC to AC inverter unit of claim 1, wherein the cooling unit controller adjusts the cooling unit to maintain the inverter at a second temperature sufficient to allow the inverter to be overdriven to have an optimized power output over the rated power output.

3. The DC to AC inverter unit of claim 1, wherein the cooling unit comprises a cooling air fan.

4. The DC to AC inverter unit of claim 1, wherein the cooling unit comprises an air conditioner.

5. The DC to AC inverter unit of claim 1, further comprising a DC input from a solar module to the DC to AC inverter.

6. The DC to AC inverter unit of claim 1, wherein the cooling unit controller adjusts the cooling unit to maintain the inverter at a second temperature sufficient to allow the inverter to be overdriven to increase power output by at least 5% over the rated power output.

7. The DC to AC inverter unit of claim 1, wherein the cooling unit controller adjusts the cooling unit to maintain the inverter at a second temperature sufficient to allow the inverter to be overdriven to increase power output by at least 15% over the rated power output.

8. The DC to AC inverter unit of claim 1, wherein the cooling unit controller adjusts the cooling unit to keep the temperature in the enclosure below about 50 degrees C.

9. The DC to AC inverter unit of claim 1, wherein the cooling unit controller adjusts the cooling unit to keep the temperature in the enclosure below about 30 degrees C.

10. The DC to AC inverter unit of claim 1, wherein the cooling unit controller adjusts the cooling unit to keep the temperature in the enclosure below about 20 degrees C.

11. A method of cooling a DC to AC inverter, comprising:
    measuring the temperature inside an enclosure cooled by a cooling unit, the enclosure including a DC to AC inverter having a rated power output at a first temperature, wherein the DC to AC inverter is electrically connected to a photovoltaic array;
    measuring the voltage output of the photovoltaic array; and
    controlling the cooling unit based on the temperature inside the enclosure and the voltage output of the photovoltaic array.

12. The method of claim 11, wherein the cooling unit comprises a cooling air fan.

13. The method of claim 11, wherein the cooling unit comprises an air conditioner.

14. The method of claim 11, wherein controlling the cooling unit comprises maintaining the inverter at a second temperature sufficient to allow the inverter to be overdriven to increase power output by at least 5% over the rated power output.

15. The method of claim 11, wherein controlling the cooling unit comprises maintaining the inverter at a second temperature sufficient to allow the inverter to be overdriven to increase power output by at least 15% over the rated power output.

16. The method of claim 11, wherein controlling the cooling unit comprises maintaining the temperature in the enclosure below about 50 degrees C.

17. The method of claim 11, wherein controlling the cooling unit comprises maintaining the temperature in the enclosure below about 30 degrees C.

18. The method of claim 11, wherein controlling the cooling unit comprises maintaining the temperature in the enclosure below about 20 degrees C.

* * * * *